US012782398B2

(12) United States Patent
Vuillermet et al.

(10) Patent No.: US 12,782,398 B2
(45) Date of Patent: Nov. 3, 2026

(54) MR LAYOUT FOR CURRENT MEASUREMENT

(71) Applicant: Allegro MicroSystems, LLC, Manchester, NH (US)

(72) Inventors: Yannick Vuillermet, La Motte Servolex (FR); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 191 days.

(21) Appl. No.: 18/932,828

(22) Filed: Oct. 31, 2024

(65) Prior Publication Data

US 2026/0118388 A1 Apr. 30, 2026

(51) Int. Cl.
*G01R 15/20* (2006.01)
*G01R 19/00* (2006.01)

(52) U.S. Cl.
CPC ....... *G01R 15/205* (2013.01); *G01R 19/0092* (2013.01)

(58) Field of Classification Search
CPC .... G01R 33/09; G01R 15/205; G01R 33/093; G01R 33/072; G01R 33/096; G01R 33/0017; G01R 19/0092; G01R 33/0005; G01R 31/2829; G01R 33/00; G01R 15/181; G01R 33/0094; G01R 19/00; G01R 19/16547; G01R 31/3004; G01R 33/063; G01R 19/15; G01R 33/18; G01R 15/005;

(Continued)

(56) References Cited

U.S. PATENT DOCUMENTS 7,701,208 B2 * 4/2010 Nishikawa ............. G01R 33/07 324/251
7,746,065 B2 * 6/2010 Pastre .................. G01R 33/075 324/202

(Continued)

OTHER PUBLICATIONS

U.S. Appl. No. 18/609,375, filed Mar. 19, 2024, Lassalle-Balier, et al.

(Continued)

*Primary Examiner* — Vinh P Nguyen
(74) *Attorney, Agent, or Firm* — Daly, Crowley, Mofford & Durkee, LLP.

(57) ABSTRACT

An apparatus, including: a processing circuitry; a first magnetoresistance (MR) sensing element including a first sequence of first MR structures that are coupled to each other, the first sequence of first MR structures defining at least one first turn that is wound in a first direction; a second MR sensing element including a second sequence of second MR structures that are coupled to each other, the second sequence of second MR structures defining at least one second turn that is wound in a second direction, the second direction being opposite to the first direction; a third MR sensing element including a third sequence of third MR structures that are coupled to each other, the third sequence of third MR structures defining at least one third turn that is wound in the first direction; a fourth MR sensing element including a fourth sequence of fourth MR structures that are coupled to each other, the fourth sequence of fourth MR structures defining at least one fourth turn that is wound in the second direction.

32 Claims, 8 Drawing Sheets

(58) Field of Classification Search

CPC .. G01R 21/06; G01R 15/146; G01R 19/0023; G01R 31/3163; G01R 31/3173; G06F 11/3466; H10W 90/00; H10W 74/00; H10W 72/00; H10W 44/501; H10W 20/497; H10N 50/10; H10N 50/80; G01D 5/12

See application file for complete search history.

(56) References Cited

U.S. PATENT DOCUMENTS

| | | | | |
|---|---|---|---|---|
| 9,720,054 | B2 | 8/2017 | Drouin et al. | |
| 10,712,403 | B2 | 7/2020 | Drouin et al. | |
| 11,073,577 | B2 * | 7/2021 | Romero | G01P 3/487 |
| 11,994,541 | B2 * | 5/2024 | Messier | G01R 15/181 |
| 12,130,342 | B2 | 10/2024 | Lassalle-Balier et al. | |

OTHER PUBLICATIONS

U.S. Appl. No. 18/652,971, filed May 2, 2024, Campiglio, et al.
U.S. Appl. No. 18/817,473, filed Aug. 28, 2024, Belin, et al.

* cited by examiner

MR LAYOUT FOR CURRENT MEASUREMENT

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety

SUMMARY

According to aspects of the disclosure, an apparatus is provided, comprising: a first magnetoresistance (MR) sensing element including a first sequence of first MR structures that are coupled to each other, the first sequence of first MR structures defining at least one first turn that is wound in a first direction; a second MR sensing element including a second sequence of second MR structures that are coupled to each other, the second sequence of second MR structures defining at least one second turn that is wound in a second direction, the second direction being opposite to the first direction; a third MR sensing element including a third sequence of third MR structures that are coupled to each other, the third sequence of third MR structures defining at least one third turn that is wound in the first direction; a fourth MR sensing element including a fourth sequence of fourth MR structures that are coupled to each other, the fourth sequence of fourth MR structures defining at least one fourth turn that is wound in the second direction; wherein the first, second, third, and fourth sequences are arranged to form a sensing bridge, whereby a first end of the first sequence is coupled to a node N1, a second end of the first sequence is coupled to a node N2, a first end of the second sequence is coupled to the node N2, a second end of the second sequence is coupled to a node N3, a first end of the third sequence is coupled to the node N3 and a second end of the third sequence is coupled to a node N4, a first end of the fourth sequence is coupled to the node N4 and a second end of the fourth sequence is coupled to the node N1; wherein an output of the sensing bridge is provided on nodes N2 and N4, node N3 is coupled to one of a power source and ground, and node N1 is coupled to the other of the power source and ground.

According to aspects of the disclosure, an apparatus is provided, comprising: a first magnetoresistance (MR) sensing element including a first sequence of first MR structures that are coupled to each other, the first sequence of first MR structures defining at least one first turn that is wound in a first direction, the first MR structures having first pinning directions that define a first pattern, the first pattern being one of a counterclockwise pattern and a clockwise pattern; a second MR sensing element including a second sequence of second MR structures that are coupled to each other, the second sequence of second MR structures defining at least one second turn that is wound in a second direction, the second direction being opposite to the first direction, the second MR structures having second pinning directions that define a second pattern, the second pattern being the other one of the counterclockwise pattern and the clockwise pattern; a third MR sensing element including a third sequence of third MR structures that are coupled to each other, the third sequence of third MR structures defining at least one third turn that is wound in the first direction, the third MR structures having third pinning directions that define the first pattern; a fourth MR sensing element including a fourth sequence of fourth MR structures that are coupled to each other, the fourth sequence of fourth MR structures defining at least one fourth turn that is wound in the second direction, the fourth MR structures having fourth pinning directions that define the second pattern; wherein the first, second, third, and fourth sequences are arranged to form a sensing bridge.

According to aspects of the disclosure, an apparatus is provided, comprising: a processing circuitry; a first magnetoresistance (MR) sensing element including a first sequence of first MR structures that are coupled to each other, the first sequence of first MR structures defining at least one first turn that is wound in a first direction; a second MR sensing element including a second sequence of second MR structures that are coupled to each other, the second sequence of second MR structures defining at least one second turn that is wound in a second direction, the second direction being opposite to the first direction; a third MR sensing element including a third sequence of third MR structures that are coupled to each other, the third sequence of third MR structures defining at least one third turn that is wound in the first direction; a fourth MR sensing element including a fourth sequence of fourth MR structures that are coupled to each other, the fourth sequence of fourth MR structures defining at least one fourth turn that is wound in the second direction; wherein the first, second, third, and fourth sequences are arranged to form a sensing bridge that is operatively coupled to the processing circuitry, and wherein the processing circuitry is configured to generate an output signal indicative of a level of electrical current through a conductor, the output signal being generated at least in part based on an output of the sensing bridge.

BRIEF DESCRIPTION OF THE DRAWINGS

The foregoing features may be more fully understood from the following description of the drawings in which.

DETAILED DESCRIPTION

Figure 1A:
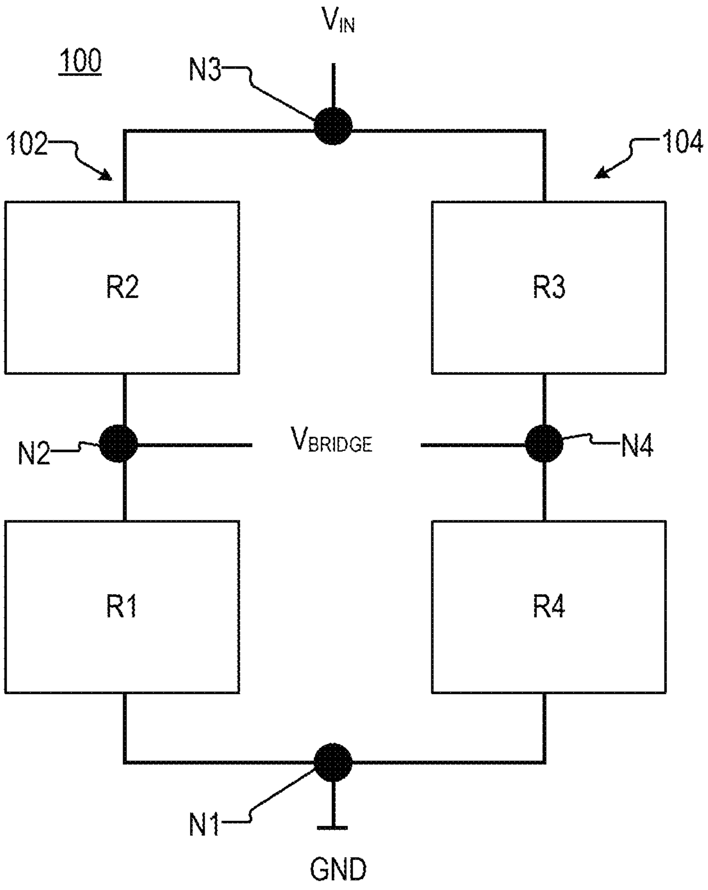
FIG. 1A is a diagram of an example of a sensing bridge, according to aspects of the disclosure.

FIG. 1A is a diagram of an example of a sensing bridge 100, according to aspects of the disclosure. As illustrated, sensing bridge 100 may include legs 102 and 104 that are coupled in parallel with each other between nodes N1 and N3. Leg 102 may include magnetoresistance (MR) elements R1 and R2 and leg 104 may include MR elements R3 and R4. Node N3 may be coupled to a voltage source $V_{IN}$ and node N1 may be coupled to ground. The output of the sensing bridge 100 may be a differential signal $V_{BRIDGE}$ that is output on nodes N2 and N4. As can be readily appreciated, the differential signal $V_{BRIDGE}$ may be equal to the difference between the voltage on node N2 and the voltage at node N4.

Figure 1B:
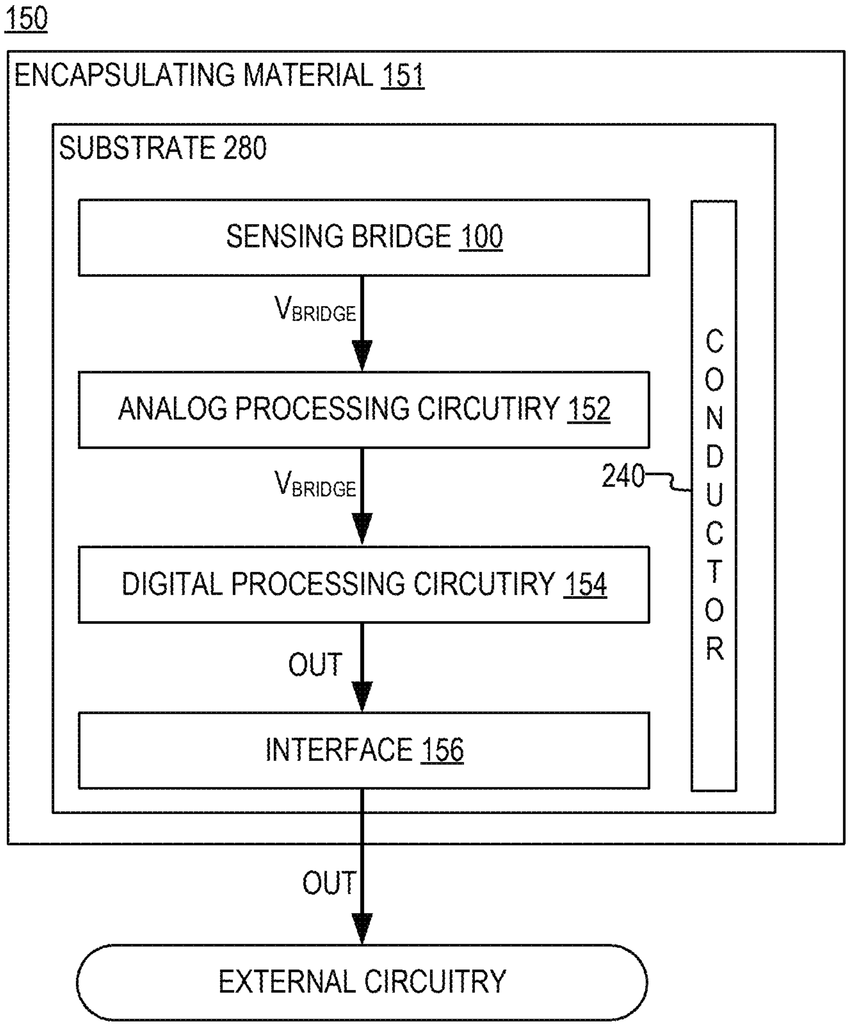
FIG. 1B is a diagram of an example of a sensor, according to aspects of the disclosure.

FIG. 1B is a diagram of a current sensor 150, according to aspects of the disclosure. As illustrated, the sensor 150 includes a substrate 280. The substrate 280 may include a silicon substrate, a sapphire substrate, and/or any other suitable type of substrate that is used in the manufacturing of semiconductor devices. Formed on substrate 280 may be the sensing bridge 100, an analog processing circuitry 152 (hereinafter "circuitry 152"), a digital processing circuitry 154 (hereinafter "circuitry 154"), and an interface 156. The substrate 280, together with sensing bridge 100, circuitry 152, circuitry 154, and interface 156 may be encapsulated in a layer of encapsulating material 151 to complete the semiconductor packaging of sensor 150. The encapsulating material 151 may include an epoxy resin, polyimide, and/or any other suitable type of dielectric material that is normally used in semiconductor packaging.

The circuitry 152 may include one or more signal filters, one or more signal modulators, one or more signal demodulators, one or more analog-to-digital converters, circuitry for performing gain and offset adjustment of the output of sensing bridge 100 (i.e., signal VBRIDGE), and/or any other suitable type of analog circuitry that can be found in magnetic field sensors. Circuitry 154 may include a special-purpose processor, a general-purpose processor, and/or any other suitable type of digital processing circuitry that is normally found in current sensors. Interface 156 may include a serial peripheral interface (SPI), a controller area network (CAN) interface, and/or any other suitable type of interface.

In operation, sensing bridge 100 may be configured to sense the electrical current through a conductor 240 and generate the signal VBRIDGE in response. Circuitry 152 may receive the signal VBRIDGE. Circuitry 152 may process and/or digitize the signal VBRIDGE and provide the digitized signal VBRIDGE to circuitry 154. Processing the signal VBRIDGE by the circuitry 152 may include any of modulating the signal VBRIDGE, demodulating the signal VBRIDGE, filtering the signal VBRIDGE, adjusting the offset of signal VBRIDGE, adjusting the gain of signal VBRIDGE, performing temperature compensation on the signal VBRIDGE, performing stress compensation on the signal VBRIDGE, and/or any other suitable type of processing that is customarily performed in magnetic field sensors.

Circuitry 154 may be configured to generate a signal OUT based on the signal VBRIDGE. Signal OUT may include any suitable type of signal that is at least in part indicative of the level of electrical current through the conductor 240. The signal OUT may be provided to interface 156. Interface 156 may provide the signal OUT to external circuitry that is coupled to the sensor 150.

FIG. 1B is provided to illustrate one possible example of a sensor architecture that can be used in conjunction with the sensing bridge 100. However, it will be understood that the present disclosure is not limited to sensor 150 having any specific architecture. Stated succinctly, the present disclosure is not limited to sensing bridge 100 being used in conjunction with any specific sensor circuitry. Those of ordinary skill in the art will readily recognize, after reading the present disclosure, that there are various sensor architectures that utilize a bridge circuit to sense a magnetic field. In this regard, it will be understood that the implemenation(s) of sensing bridge 100 which are discussed further below, can be used in any current sensor architecture that is known in the art.

In the example of FIG. 1B, sensing bridge 100 is part of an integrated circuit, whereby sensing bridge 100 is formed on the substrate (e.g., silicon die) of the integrated circuit and subsequently encapsulated in semiconductor packaging. However, alternative implementations are possible in which sensing bridge 100 is formed on a printed circuit board (PCB) or another similar substrate.

Figure 2A:
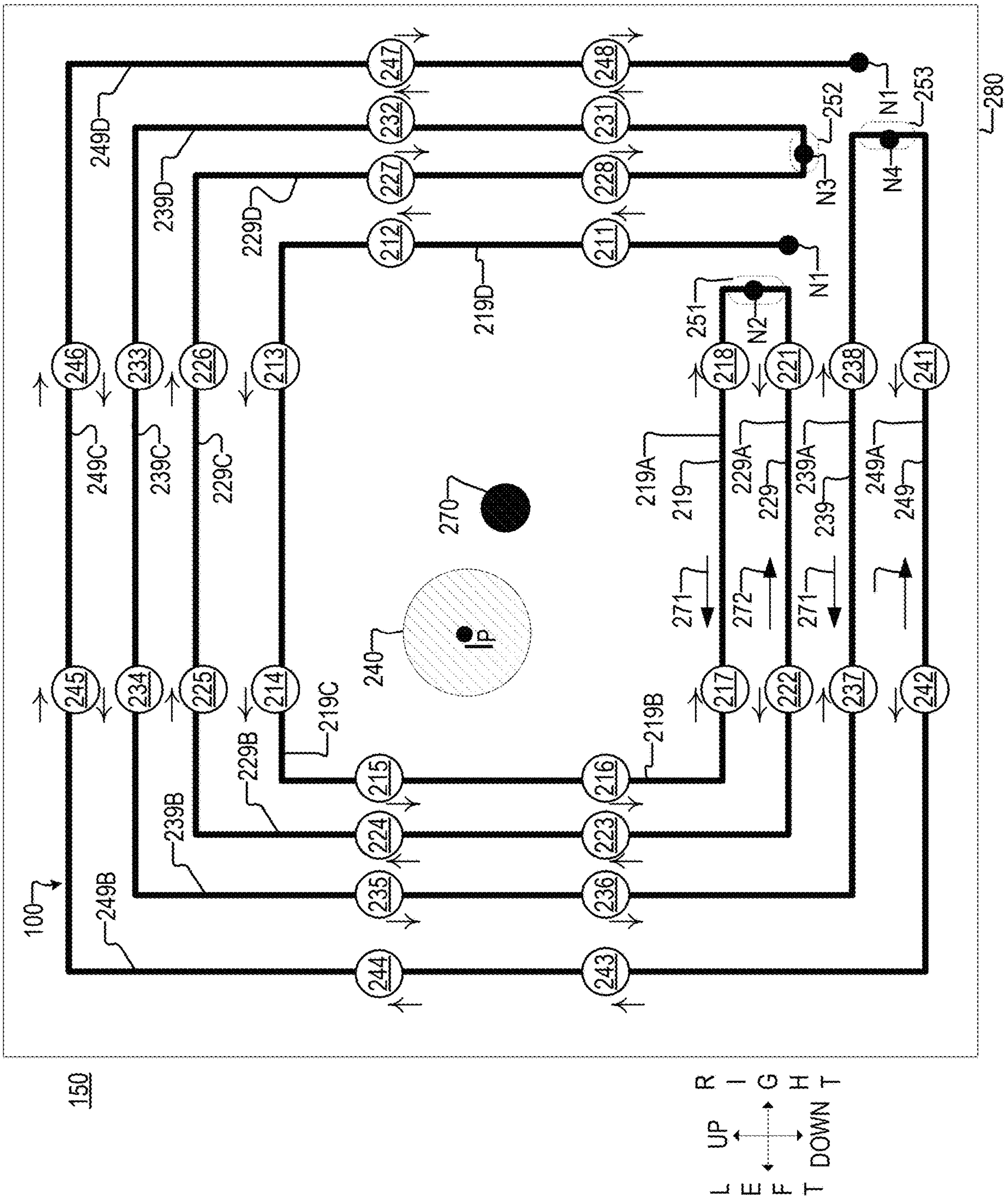
FIG. 2A is a diagram of an example of a portion of a sensor, according to aspects of the disclosure.

FIG. 2A is a top-down planar view of a portion of sensor 150, which includes the sensor 100 and the conductor 240, according to aspects of the disclosure. In the example of FIG. 2A, sensing bridge 100 includes nested turns 219, 229, 239, and 249. In the example of FIG. 2A, turn 219 is nested inside turns 229, 239, and 249; turn 229 is nested inside turns 239 and 249; and turn 239 is nested inside turn 249. According to the present example, turns 219, 229, 239, and 249 are coupled in series with each other. Specifically, turns 219 and 229 are coupled to each other via a conductor 251; turns 229 and 239 are coupled to each other via a conductor 252, and the turns 239 and 249 are coupled to each other by a conductor 253. When the sensing bridge 100 is energized, turns 219 and 239 may conduct electrical current in a first direction 271 (clockwise direction) and turns 229 and 249 may conduct electrical current in a second direction 272 (e.g., counterclockwise direction). Each of turns 219, 229, 239, and 249 may be configured to at least partially surround a reference point 270 in substrate 280.

Each of turns 219, 229, 239, and 249 is configured to implement a different one of MR elements R1-R4. According to the present example, turn 219 includes MR pillars 211, 212, 213, 214, 215, 216, 217, and 218, which are coupled in series to one another and together implement MR element R1. Turn 229 includes MR pillars 221, 222, 223, 224, 225, 226, 227, and 228, which are coupled in series to one another and together implement MR element R2. Turn 239 includes MR pillars 231, 232, 233, 234, 235, 236, 237, and 238, which are coupled in series to one another and together implement MR element R3. Turn 249 includes MR pillars 241, 242, 243, 244, 245, 246, 247, and 248, which are coupled in series to one another and together implement MR element R4.

According to the present example, each of MR elements R1-R4 is a tunneling magnetoresistance (TMR) element, and each of MR pillars 211-248 is a TMR pillar. However, alternative implementations are possible in which any of MR elements R1-R4 is another type of magnetoresistor, such as an anisotropic magnetoresistance (AMR) element or a giant magnetoresistance (GMR) element. In some implementations, each or MR elements R1-R4 may include one or more TMR vortices. Additionally or alternatively, in some implementations, each of MR elements R1-R4 may be a serial and/or parallel combination of TMR pillars or other MR sub-elements. Stated succinctly, the present disclosure is not limited to any specific implementation of MR elements R1-R4.

MR pillars 211-248 are coupled in series to each other via conductive traces. Each conductive trace extends between a respective pair of the MR pillars 211-248 and is depicted as a solid black line FIG. 2A. Nodes N1, N2, N3, and N4 are marked in FIG. 2A by using solid black circles, which show where one has to tap into the series of MR pillars to cause the series of MR elements to operate as a sensing bridge (i.e., the sensing bridge 100 which is shown in FIG. 1A).

Each of turns 219, 229, 239, and 249 includes a plurality of MR pillars that are electrically coupled in series and/or in parallel with each other. The MR pillars in each of turns 219, 229, 239, and 249 are depicted as circles. The respective pinning direction of each MR element is identified by an arrow that is situated above the circle representing the MR element. In the example of FIG. 2A, the pinning direction of each of the MR pillars in sensing bridge 100 may be one of UP, DOWN, LEFT, and RIGHT. As used herein, the term "pinning direction of an MR pillar" refers to the orientation of the magnetization in the pinned (or reference) layer of the MR pillar. MR elements, in general, include two ferromagnetic layers-namely, a pinned layer and a free layer which are separated by a spacer. The resistance of the MR element is determined by the relative alignment of the respective magnetizations of the free layer and the pinned layer. The magnetization orientation of the free layer changes with the magnetic field that is incident on the MR element.

Table 1 below shows the pinning direction of each of MR pillars 211-248. In addition, Table 1 provides a respective pair of i and j indices for each of MR pillars 211-248 and identifies the MR element that the pillar is used to implement. Table 1 illustrates that: the pinning directions of the MR pillars in turn 219 define a counterclockwise pattern; the pinning directions of the MR elements in turn 229 define a clockwise pattern; the pinning directions of the MR elements in turn 239 define a counterclockwise pattern; and the pinning directions in of the MR elements in turn 249 define a clockwise pattern.

TABLE 1

| MR PILLAR | PINNING DIRECTION | INDEX I | INDEX J | IS PART OF | LOCATION INDEX P |
|---|---|---|---|---|---|
| 211 | UP | 1 | 1 | R1 | 1 |
| 212 | UP | 1 | 2 | R1 | 2 |
| 213 | LEFT | 1 | 3 | R1 | 3 |
| 214 | LEFT | 1 | 4 | R1 | 4 |
| 215 | DOWN | 1 | 5 | R1 | 5 |
| 216 | DOWN | 1 | 6 | R1 | 6 |
| 217 | RIGHT | 1 | 7 | R1 | 7 |
| 218 | RIGHT | 1 | 8 | R1 | 8 |
| 221 | LEFT | 2 | 8 | R2 | 8 |
| 222 | LEFT | 2 | 7 | R2 | 7 |
| 223 | UP | 2 | 6 | R2 | 6 |
| 224 | UP | 2 | 5 | R2 | 5 |
| 225 | RIGHT | 2 | 4 | R2 | 4 |
| 226 | RIGHT | 2 | 3 | R2 | 3 |
| 227 | DOWN | 2 | 2 | R2 | 2 |
| 228 | DOWN | 2 | 1 | R2 | 1 |
| 231 | UP | 3 | 1 | R3 | 1 |
| 232 | UP | 3 | 2 | R3 | 2 |
| 233 | LEFT | 3 | 3 | R3 | 3 |
| 234 | LEFT | 3 | 4 | R3 | 4 |
| 235 | DOWN | 3 | 5 | R3 | 5 |
| 236 | DOWN | 3 | 6 | R3 | 6 |
| 237 | RIGHT | 3 | 7 | R3 | 7 |
| 238 | RIGHT | 3 | 8 | R3 | 8 |
| 241 | LEFT | 4 | 8 | R4 | 8 |
| 242 | LEFT | 4 | 7 | R4 | 7 |
| 243 | UP | 4 | 6 | R4 | 6 |
| 244 | UP | 4 | 5 | R4 | 5 |
| 245 | RIGHT | 4 | 4 | R4 | 4 |
| 246 | RIGHT | 4 | 3 | R4 | 3 |
| 247 | DOWN | 4 | 2 | R4 | 2 |
| 248 | DOWN | 4 | 1 | R4 | 1 |

In the example of FIG. 2A, each of turns 219, 229, 239, and 249 includes eight MR pillars. However, the present disclosure is not limited to any specific number of MR pillars being present in any of turns 219, 229, 239, and 249. Turn 219 may include portions 219A, 219B, 219C, and 219D. Although, in the example of FIG. 2A, portions 219A-D each include two MR elements, in alternative implementations, any of portions 219A-D may include a different number of MR pillars. Turn 229 may include portions 229A, 229B, 229C, and 229D. Although, in the example of FIG. 2A, portions 229A-D each include two MR elements, in alternative implementations, any of portions 229A-D may include a different number of MR pillars. Turn 239 may include portions 239A, 239B, 239C, and 239D. Although, in the example of FIG. 2A, portions 239A-D each include two MR elements, in alternative implementations, any of portions 239A-D may include a different number of MR pillars. Turn 249 may include portions 249A, 249B, 249C, and 249D. Although, in the example of FIG. 2A, portions 249A-D each include two MR elements, in alternative implementations, any of portions 249A-D may include a different number of MR pillars. In a preferred implementation, each of turns 219, 229, 239, and 249 may have the same number of MR pillars. However, the present disclosure is not limited to any number of MR pillars being present disclosure is not limited thereto.

In another aspect, Table 1 and FIG. 2A illustrate that the MR pillars are arranged in a consecutive order. As indicated by Table 1, each of the MR pillars in sensing bridge 100 may be assigned an i-index and a j-index. In this regard, the i-index and j-index for any of the MR pillars may be combined to produce a sequence number for the same MR pillar. The combination may be performed in accordance with equations 1.1 and 1.2 below:

$$seqNumber_{i,j} = N*(i-1)+j, \text{ when i is an even number} \quad (1.1)$$

$$seqNumber_{i,j} = N*(i-1)+j+1-N, \text{ when i is an even number} \quad (1.2)$$

Where $seqNumber_{i,j}$ is the sequence number for the MR element having j-index value that is equal to j and an i-index value that is equal to i, and N is the number of pillars in each of the turns 219, 229, 239, and 249 (i.e., N=8 in the example of FIG. 2A). Under the nomenclature of the present disclosure, two MR pillars are consecutive if they have consecutive sequence numbers. For example, MR pillars 211 and 222 are considered consecutive because they have sequence numbers '1' and '2' respectively. Similarly, MR pillars 218 and 221 are considered consecutive because they have sequence numbers of '8' and '9' respectively.

In yet another aspect, Table 1 assigned a position number p for each of the MR pillars 211-248. Under the nomenclature of the present disclosure, MR pillars that are assigned the same position number are positioned in the same region (or portion) of the substrate 280. The phrases "MR pillar having a position number p" and "MR pillar situated at location p" are used interchangeably when permitted by context. The position numbers p of the MR elements 211-249 are used further below in the mathematical model discussed with respect to equations 7-10, which describes aspects of the operation of the sensing bridge 100.

Figure 2B:
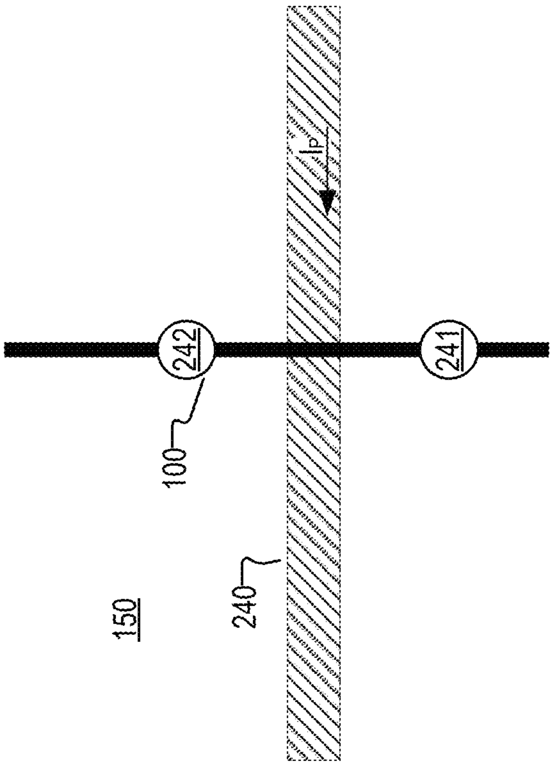
FIG. 2B is a diagram of an example of a portion of a sensor, according to aspects of the disclosure.

FIG. 2B is a side view of the portion of sensor 150 that is shown in FIG. 2A. FIG. 2B is provided to illustrate that the conductor 240 may extend in a direction that is perpendicular (or otherwise transverse) to the plane of substrate 280 where the MR pillars 211-248 are formed. In other words, the current IP, which flows through conductor 240, and which is being measured by sensing bridge 100, flows in a direction that is perpendicular (or otherwise transverse) to the plane of substrate 280. In another respect, FIGS. 2A-B illustrates that any of the turns which form MR elements R1-R4 (i.e., turns 219, 229, 239, and 249) may at least partially surround the conductor whose current is being measured (i.e., conductor 240). In a preferred implementation, the conductor 240 may be fully surrounded by each of the turns 219, 229, 239, and 249. However, it will be understood that in some implementations, any of the turns 212, 229, 239, and 249 may only partially surround the conductor 240.

In the example of FIG. 2A, each of turns 219, 229, 239, and 249 forms a single complete loop around reference point 270. However, alternative implementations are possible in which some or all of turns 219, 229, 239, and 249 forms multiple loops around reference point 270 (and/or conductor 240). In a preferred implementation, all of turns 219, 229, 239, and 249 may have the same number of loops. However, the present disclosure is not limited thereto. Furthermore, in some implementations, the loops that make a turn may change directions. For example, a first one of the loops may wind in a clockwise direction, a second one of the loops may wind in the counterclockwise direction, and a third one of the loops may wind in the clockwise direction. In this example, each of the loops includes one or more MR elements, the first, second, and third loops are connected in series, and the second loop is disposed between the first and third loops. In some implementations, all loops that make up a given turn may be formed in the same perimeter.

Figure 3:
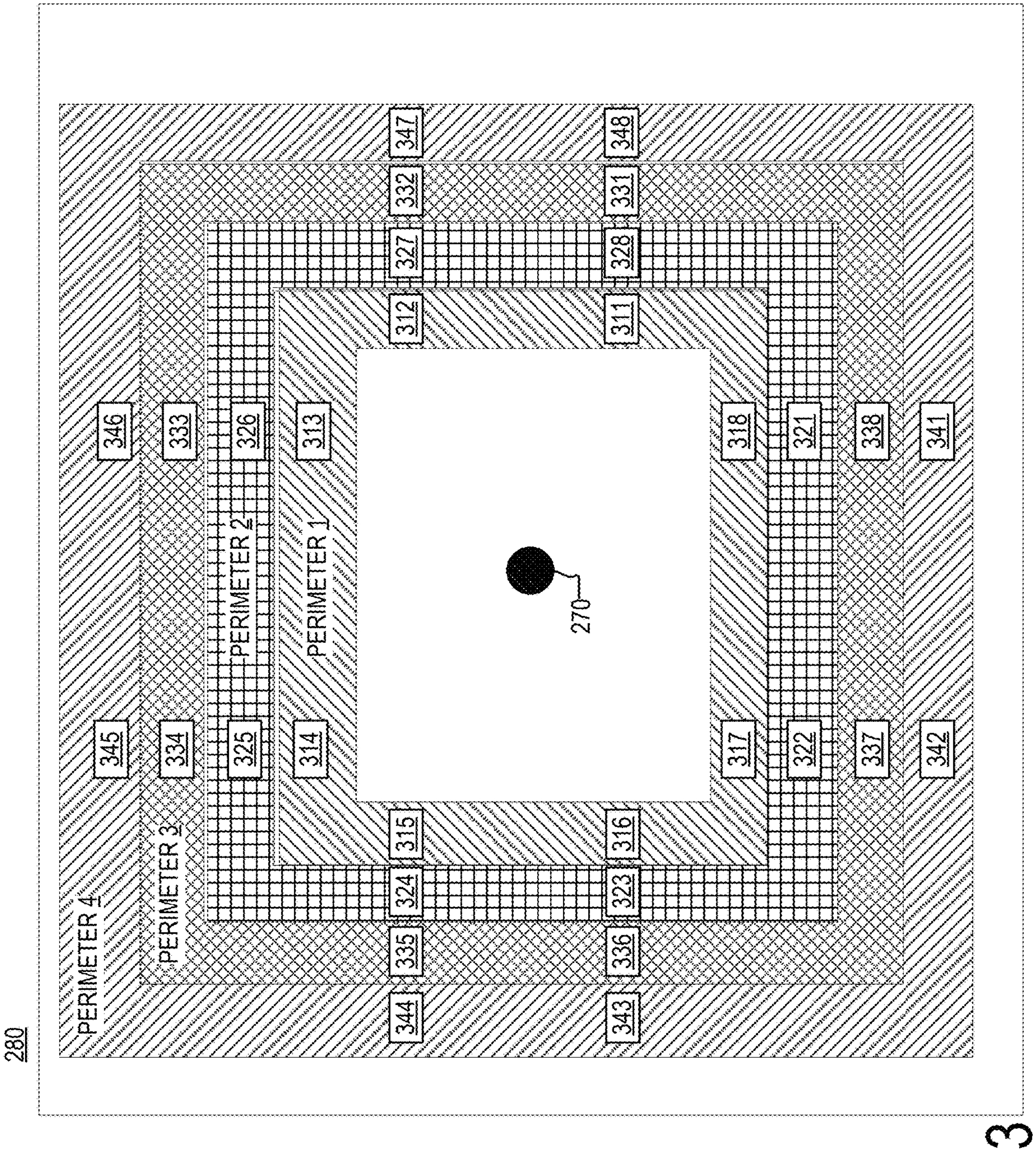
FIG. 3 is a diagram of an example of sensor substrate, according to aspects of the disclosure

FIG. 3 shows a map of substrate 280, according to aspects of the disclosure. As illustrated, the surface of substrate 280 may be divided into perimeters 1, 2, 3, and 4. Each of perimeters 1-4 surrounds reference point 270. In addition, perimeter 1 is surrounded by perimeter 2; perimeter 2 is surrounded by perimeter 3; and perimeter 3 is surrounded by perimeter 4. In the example of FIG. 3, each of perimeters 1-4 is shaped as a square ring (or square annulus). However, the present disclosure is not limited to perimeters 1-4 having any specific shape. For example, any of perimeters 1 may have a circular or oval shape. Furthermore, in some implementations, any of perimeters 1-4 may have an irregular shape. In another aspect, FIG. 3 denotes a set of physical locations on the main surface of substrate 280 where the MR pillars 211-248 can be formed. In the present example, perimeter 1 includes physical locations 311-318; perimeter 2 includes physical locations 321-328; perimeter 3 includes physical locations 331-338; and perimeter 4 includes physical locations 341-348.

Table 2 below shows the physical location and perimeter where each of sensing elements 211-248 is located in accordance with the physical layout for sensing bridge 100 that is shown in FIG. 2A.

TABLE 2

| MR PILLAR | PHYSICAL LOCATON | PERIMETER |
|---|---|---|
| 211 | 311 | 1 |
| 212 | 312 | 1 |
| 213 | 313 | 1 |
| 214 | 314 | 1 |
| 215 | 315 | 1 |
| 216 | 316 | 1 |
| 217 | 317 | 1 |
| 218 | 318 | 1 |
| 221 | 321 | 2 |
| 222 | 322 | 2 |
| 223 | 323 | 2 |
| 224 | 324 | 2 |
| 225 | 325 | 2 |
| 226 | 326 | 2 |
| 227 | 327 | 2 |
| 228 | 328 | 2 |
| 231 | 331 | 3 |
| 232 | 332 | 3 |
| 233 | 333 | 3 |
| 234 | 334 | 3 |
| 235 | 335 | 3 |
| 236 | 336 | 3 |
| 237 | 337 | 3 |
| 238 | 338 | 3 |
| 241 | 341 | 4 |
| 242 | 342 | 4 |
| 243 | 343 | 4 |
| 244 | 344 | 4 |
| 245 | 345 | 4 |
| 246 | 346 | 4 |
| 247 | 347 | 4 |
| 248 | 348 | 4 |

In some respects, Table 2 illustrates that in the example of FIG. 2A, each one of turns 219-249 is formed in a different one of perimeters 1-4. Specifically, MR pillars 311-318, which form MR element R1, are formed in perimeter 1; MR pillars 321-328, which form MR element R2, are formed in perimeter 2; MR pillars 331-338, which form MR element R3, are formed in perimeter 3; and MR pillars 341-348, which form MR element R4, are formed in perimeter 4.

Figure 4:
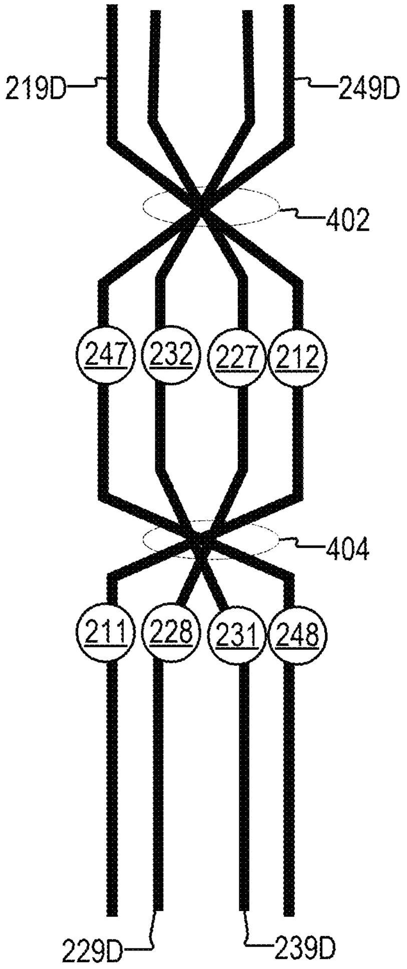
FIG. 4 is a partial diagram of an example of a portion of a sensing bridge, according to aspects of the disclosure.

FIG. 4 shows an example of an alternative arrangement for MR pillars 211-248. FIG. 4 is a partial view of sensing bridge 100. In the example of FIG. 4, MR pillars 211-248 are organized in an alternative spatial arrangement in which the MR pillars 211-218 and 241-248 alternate between being positioned in perimeters 1 and 4, and MR pillars 221-228 and 231-238 alternate between being positioned in perimeters 2 and 3. This arrangement is herein referred to as an "interlaced arrangement".

FIG. 4 illustrates that the conductive traces that form each of turns 219, 229, 239, and 249 cross over each other at cross-over points 402 and 404. At each of intersection points 402 and 404, the conductive trace that forms each of turns 219, 229, 239, and 249 passes above or below the conductive traces that are used to form the remaining ones of turns 219, 229, 239, and 249 without coming in electrical contact with them. In other words, at each of cross-over points 402-404, turns 219, 229, 239, and 249 are electrically isolated from each other.

FIG. 4 provides an example of an interlaced arrangement in which, out of any two consecutive MR pillars in turn 219, one would be situated in 1 while the other is situated in 4; out of any two consecutive MR pillars in turn 229, one would be situated in 2 while the other is situated in 3; out of any two consecutive MR pillars in turn 239, one would be situated in 2 while the other is situated in 3; and out of any two consecutive MR pillars in turn 249, one would be situated in 1 while the other is situated in 4. Table 3 below shows an example of the physical location of each of MR pillars 211-248 when sensing bridge 100 is configured in accordance with the interlaced arrangement of FIG. 4:

TABLE 3

| MR PILLAR | PHYSICAL LOCATON | PERIMETER |
|---|---|---|
| 211 | 311 | 1 |
| 212 | 347 | 4 |

TABLE 3-continued

| MR PILLAR | PHYSICAL LOCATON | PERIMETER |
|---|---|---|
| 213 | 313 | 1 |
| 214 | 345 | 4 |
| 215 | 315 | 1 |
| 216 | 343 | 4 |
| 217 | 317 | 1 |
| 218 | 341 | 4 |
| 221 | 338 | 3 |
| 222 | 322 | 2 |
| 223 | 336 | 3 |
| 224 | 324 | 2 |
| 225 | 334 | 3 |
| 226 | 326 | 2 |
| 227 | 332 | 3 |
| 228 | 328 | 2 |
| 231 | 331 | 3 |
| 232 | 327 | 2 |
| 233 | 333 | 3 |
| 234 | 325 | 2 |
| 235 | 335 | 3 |
| 236 | 323 | 2 |
| 237 | 337 | 3 |
| 238 | 321 | 2 |
| 241 | 318 | 1 |
| 242 | 342 | 4 |
| 243 | 316 | 1 |
| 244 | 344 | 4 |
| 245 | 314 | 1 |
| 246 | 346 | 4 |
| 247 | 312 | 1 |
| 248 | 348 | 4 |

TABLE 4-continued

| MR PILLAR | PHYSICAL LOCATON | PERIMETER |
|---|---|---|
| 213 | 333 | 3 |
| 214 | 345 | 4 |
| 215 | 315 | 1 |
| 216 | 323 | 2 |
| 217 | 337 | 3 |
| 218 | 341 | 4 |
| 221 | 318 | 1 |
| 222 | 342 | 4 |
| 223 | 336 | 3 |
| 224 | 324 | 2 |
| 225 | 314 | 1 |
| 226 | 346 | 4 |
| 227 | 332 | 3 |
| 228 | 328 | 2 |
| 231 | 331 | 3 |
| 232 | 347 | 4 |
| 233 | 313 | 1 |
| 234 | 325 | 2 |
| 235 | 335 | 3 |
| 236 | 343 | 4 |
| 237 | 317 | 1 |
| 238 | 321 | 2 |
| 241 | 338 | 3 |
| 242 | 322 | 2 |
| 243 | 316 | 1 |
| 244 | 344 | 4 |
| 245 | 334 | 3 |
| 246 | 326 | 2 |
| 247 | 312 | 1 |
| 248 | 348 | 4 |

Figure 5:
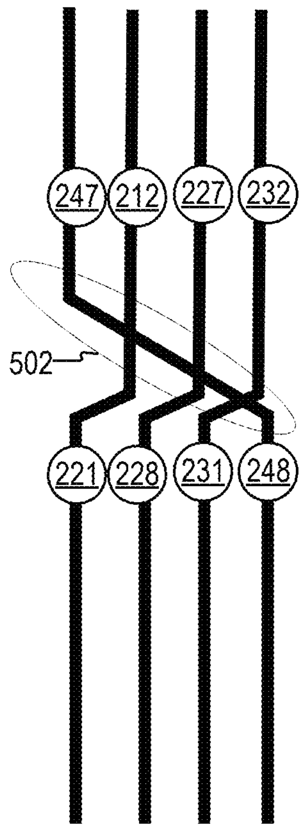
FIG. 5 is a partial diagram of an example of a portion of a sensing bridge, according to aspects of the disclosure.

FIG. 5 shows an example of an alternative arrangement for MR pillars 211-248. FIG. 5 is a partial view of sensing bridge 100. In the example of FIG. 5, MR pillars 211-248 are organized in an alternative spatial arrangement in which each consecutive MR pillar is positioned one perimeter further from reference point 270 than the MR pillar immediately preceding it, unless the immediately preceding pillar is already situated in the outermost perimeter 4, in which case the consecutive pillar is placed in the positioned in the innermost perimeter 1. In some implementations, this arrangement can be described by one of equations 2.1 and 2.2 below:

$$P(\text{pillar}_s) = \text{mod}(+P(\text{pillar}_{s-1}), CP) + 1 \quad (2.1)$$

$$P(\text{pillar}_s) = \text{mod}(-P(\text{pillar}_{s-1}), CP) + 1 \quad (2.2)$$

Equation 2.1 applies when pillar s is part of a loop that winds in the clockwise direction. Equation 2.2 applies when pillar s is part of a loop that winds in the counterclockwise direction. $P(\text{pillar}_s)$ is the perimeter where the pillar having a sequence number s is positioned, $P(\text{pillar}_{s-1})$ is the perimeter where the pillar having sequence number s−1 is positioned, and CP is the total count of perimeters that are available to place MR pillars in. Under this arrangement the first sequence number is s=1. The MR pillar bearing sequence number s=1 can be placed in any perimeter. Table 4 below shows an example of one specific spatial arrangement that can be generated in accordance with equation 2.

TABLE 4

| MR PILLAR | PHYSICAL LOCATON | PERIMETER |
|---|---|---|
| 211 | 311 | 1 |
| 212 | 327 | 2 |

FIG. 5 illustrates that the conductive traces that form each of turns 219, 229, 239, and 249 cross over each other at cross-over point 502. At cross-over point 502, the conductive trace that forms each of turns 219, 229, 239, and 249 passes above or below the conductive traces that are used to form the remaining ones of turns 219, 229, 239, and 249 without coming in electrical contact with them.

In one respect, the implementation of sensing bridge 100 shown in FIG. 2A is fundamentally a loop, and, as such, any transient or AC magnetic flux through the loop, which is caused by nearby conductors other than the conductor 240, can induce a current in the loop, which is herein referred to as an "inductive kick". The inductive kick will create additional voltage on VBRIDGE, which would be seen as an error. The arrangement that is shown FIG. 2A is designed to limit the indictive kick that is incident on the sensing bridge kick 100. The arrangements illustrated by FIGS. 4-5 show further refinements of the design of FIG. 2A, which are intended to limit the inductive kick even further. Specifically, FIGS. 4-5 illustrate an example in which the MR pillars that form each of the MR elements in sensing bridge 100 are mixed with the MR pillars used to implement at least another one of the MR elements. In this context, the term "mixing" refers to placing MR pillars used to form different MR elements in the same perimeter or region or perimeter of substrate 280, which causes the turn that is used to implement one MR element to cross over the turn(s) that are used to implement one or more of the other MR elements in the sensing bridge. It is noted that those of ordinary skill in the art will readily recognize, after reading the present disclosure, that there are various ways to mix the MR pillars in sensing bridge 100 and that the present disclosure is not limited to the example of FIGS. 4-5.

A discussion is now provided of the operation of sensing bridge 100, according to aspects of the disclosure. The most general expression of Ampere's law on electromagnetism is provided by equation 3 below:

$$\oint \vec{B}\cdot\vec{dl} = \mu_0 \cdot Ip \tag{3}$$

Where B is the magnetic field, dl is an infinitesimal element of a closed loop, Ip is the current enclosed by the loop (i.e., the current that is being measured by sensing bridge 100), and μ0≈4π×10-7 T m/A.

In a real application, sensing elements are usually discrete: assuming a constant step size dl between elements, and each of the sensing elements having an axis of maximum sensitivity that of each of the sensing elements that is parallel to the conductive trace that connects the sensing element to at least one of its neighbors (as shown in FIG. 2A, equation 4 becomes:

$$dl \cdot \sum\nolimits_{i=1}^{n} B_i = \mu_0 \cdot Ip \tag{4}$$

The output $V_{BRIDGE}$ of sensing bridge 100 in equation 5 below, where $R_1$ is the resistance of MR element R1, $R_2$ is the resistance of sensing element R2, $R_3$ is the resistance of MR element R3, and $R_4$ is the resistance of MR element R4, and $V_{IN}$ is the input voltage to sensing bridge 100 (supplied at node N3).

$$V_{bridge} = \frac{R_1 \cdot R_3 - R_2 \cdot R_4}{(R_1 + R_2)\cdot(R_3 + R_4)} \cdot V_{in} \tag{5}$$

The resistance of each MR element in sensing bridge 100 (shown in FIGS. 1 and 2A) is expressed by equation 6 below, where n is the total count of MR pillars in the turn that is used to implement the MR element, and $R_{ji}$ is the individual resistance of the i-th MR pillar in turn j. As noted above, the j-index value for turn 219 is 1, the j-index value for turn 229 is 2, the j-index value for turn 239 is 3, and the j-index value for turn 249 is 4.

$$\sum\nolimits_{i=1}^{n} R_{ji} = R_j \tag{6}$$

Assuming that the magnetic field experienced by all adjacent MR pillars that are situated at location p is the same, irrespective of the turn which the MR pillars are part of, then equation 7 below may be derived from equation 5 and 6:

$$V_{bridge} = \frac{\sum_{p=1}^{n} R_{1p} - \sum_{p=1}^{n} R_{2p}}{\sum_{p=1}^{n} (R_{1p} + R_{2p})} \cdot V_{in} \tag{7}$$

Now, assume that the resistance $R_{1i}$ of any of MR pillars 211-218 and 231-238 is given by equation 8 below, where $R_0$ is the resistance in zero magnetic field, α is the sensitivity of the MR pillar and Bp is the applied magnetic field at location p:

$$R_{1p} = R_0 \cdot (1 + \alpha \cdot B_p) \tag{8}$$

Further assume that the resistance $R_{2i}$ of any of MR pillars 221-228 and 241-248 is given by equation 9 below, where $R_0$ is the resistance in zero magnetic field, α is the sensitivity of the MR pillar and Bp is the applied magnetic field at location p:

$$R_{2p} = R_0 \cdot (1 - \alpha \cdot B_p) \tag{9}$$

In view of equations 8 and 9, the output $V_{BRIDGE}$ of sensing bridge 100 can be described by equation 10 below, which demonstrates that the output of sensing bridge 100, when sensing bridge is arranged in accordance with the layout shown in FIG. 2A, is proportional to the level of the electrical current Ip that is being measured:

$$V_{bridge} = \frac{2\alpha \sum_{p=1}^{n} B_p}{n} \cdot V_{in} \tag{10}$$

The relationship between the output $V_{BRIDGE}$ of sensing bridge 100 and the level of the electrical current Ip that is being measured is described by equation 11 below:

$$Ip = \frac{V_{bridge}}{V_{in}} \cdot \frac{n}{2\alpha} \cdot \frac{dl}{\mu_0} \tag{11}$$

Figure 6:
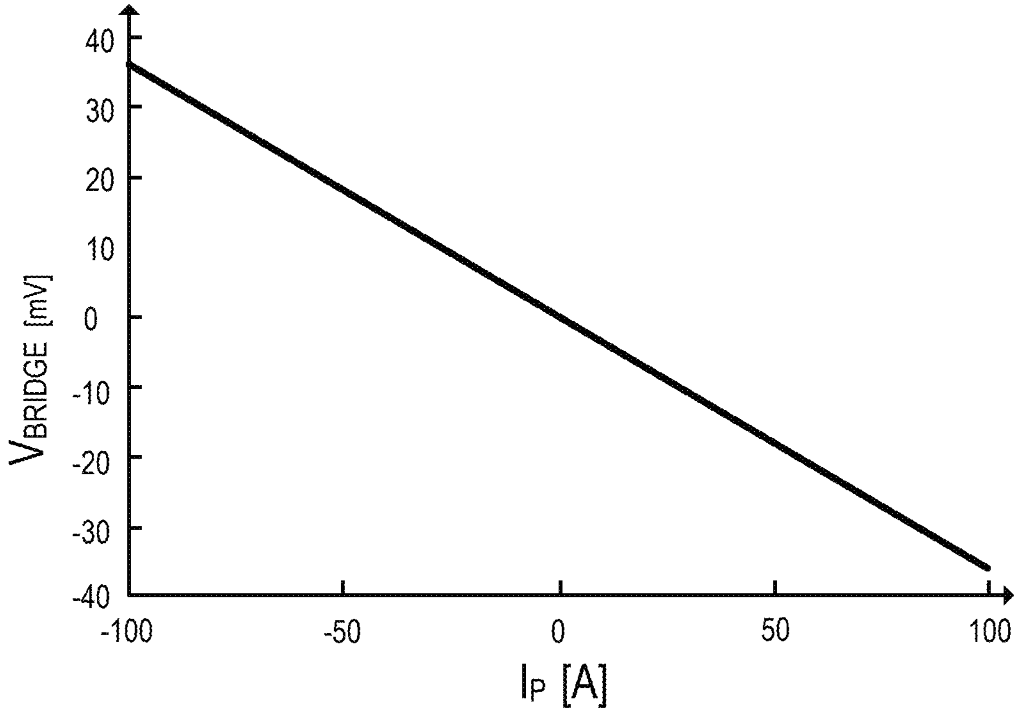
FIG. 6 is a graph illustrating aspects of the operation of the sensing bridge of FIG. 2A, according to aspects of the disclosure.

FIG. 6 is graph showing the relationship between the output $V_{BRIDGE}$ of sensing bridge 100 and the measured electrical current Ip. The X-axis of the graph represents the electrical current Ip that is being measured (and which flows through conductor 240), and the Y-axis of the graph represents the output $V_{BRIDGE}$ of sensing bridge 100. FIG. 6 is provided to illustrate that the layout for sensing bridge 100 that is shown in FIG. 2A results in the sensing bridge 100 having a substantially linear response.

A magnetic-field sensing element can be, but is not limited to, a Hall Effect element a magnetoresistance element, or an inductive coil. As is known, there are different types of Hall Effect elements, for example, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). The phrase "set of magnetic field elements" shall mean "one or more magnetic field sensing elements".

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special-purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., an addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. An apparatus, comprising:

a first magnetoresistance (MR) sensing element including a first sequence of first MR structures that are coupled to each other, the first sequence of first MR structures defining at least one first turn that is wound in a first direction;

a second MR sensing element including a second sequence of second MR structures that are coupled to each other, the second sequence of second MR structures defining at least one second turn that is wound in a second direction, the second direction being opposite to the first direction;

a third MR sensing element including a third sequence of third MR structures that are coupled to each other, the third sequence of third MR structures defining at least one third turn that is wound in the first direction;

a fourth MR sensing element including a fourth sequence of fourth MR structures that are coupled to each other, the fourth sequence of fourth MR structures defining at least one fourth turn that is wound in the second direction;

wherein the first, second, third, and fourth sequences are arranged to form a sensing bridge, whereby a first end of the first sequence is coupled to a node N1, a second end of the first sequence is coupled to a node N2, a first end of the second sequence is coupled to the node N2, a second end of the second sequence is coupled to a node N3, a first end of the third sequence is coupled to the node N3 and a second end of the third sequence is coupled to a node N4, a first end of the fourth sequence is coupled to the node N4 and a second end of the fourth sequence is coupled to the node N1;

wherein an output of the sensing bridge is provided on nodes N2 and N4, node N3 is coupled to one of a power source and ground, and node N1 is coupled to the other of the power source and ground.

2. The apparatus of claim 1, further comprising a substrate, wherein the first, second, third, and fourth sequences are formed on the substrate, and each of the MR structures is a tunneling magnetoresistance (TMR) vortex.

3. The apparatus of claim 1, further comprising a substrate and a conductor arranged to conduct an electrical current that is being measured by the sensing bridge, wherein the first, second, third, and fourth sequences are formed on the substrate, and the conductor extends through the substrate.

4. The apparatus of claim 1, wherein the first sequence is nested in the second sequence, the second sequence is nested in the third sequence, and the third sequence is nested in the fourth sequence.

5. The apparatus of claim 1, further comprising a conductor that is configured to conduct an electrical current that is being measured by the sensing bridge, wherein each of the first, second, third, and fourth sequences is configured to at least partially surround the conductor.

6. The apparatus of claim 1, wherein:

each of the first MR structures has a respective first pinning direction, such that the first pinning directions of the first MR structures define a first pattern, the first pattern being one of a counterclockwise pattern and a clockwise pattern;

each of the second MR structures has a respective second pinning direction, such that the second pinning directions of the second MR structures define a second pattern, the second pattern being the other one of the counterclockwise pattern and the clockwise pattern;

each of the third MR structures has a respective third pinning direction, such that the third pinning directions of the third MR structures define the first pattern; and each of the fourth MR structures has a respective fourth pinning direction, such that the fourth pinning directions of the fourth MR structures define the second pattern.

7. The apparatus of claim 1, further composing a substrate, wherein:

the substrate includes respective first, second, third, and fourth perimeters, the first perimeter being nested in the second perimeter, the second perimeter being nested in the third perimeter, and the third perimeter being nested in the fourth perimeter, and the first MR structures are formed in the first perimeter of the substrate, the second MR structures are formed in the second perimeter of the substrate, the third MR structures are formed in the third perimeter of the substrate, and the fourth MR structures are formed in the fourth perimeter of the substrate.

8. The apparatus of claim 1, further composing a substrate, wherein:

the substrate includes respective first, second, third, and fourth perimeters, the first perimeter being nested in the second perimeter, the second perimeter being nested in the third perimeter, and the third perimeter being nested in the fourth perimeter, and the first MR structures alternate between being situated in the first perimeter and the fourth perimeter;

the second MR structures alternate between being situated in the second perimeter and the third perimeter;

the third MR structures alternate between being situated in the second perimeter and the third perimeter; and the fourth MR structures alternate between being situated in the first perimeter and the fourth perimeter.

9. The apparatus of claim 1, further comprising a substrate, wherein:

the substrate includes respective first, second, third, and fourth perimeters, the first perimeter being nested in the second perimeter, the second perimeter being nested in the third perimeter, and the third perimeter being nested in the fourth perimeter, and at least one of the first MR structures is formed in each of the first, second, third, and fourth perimeters of the substrate;

at least one of the second MR structures is formed in each of the first, second, third, and fourth perimeters of the substrate;

at least one of the third MR structures is formed in each of the first, second, third, and fourth perimeters of the substrate; and at least one of the second MR structures is formed in each of the first, second, third, and fourth perimeters of the substrate.

10. The apparatus of claim 1, further comprising a substrate, wherein:

the substrate includes respective first, second, third, and fourth perimeters, the first perimeter being nested in the second perimeter, the second perimeter being nested in the third perimeter, and the third perimeter being nested in the fourth perimeter, and at least two of the first MR structures are formed in different ones of the first, second, third, and fourth perimeters of the substrate;

at least two of the second MR structures are formed in different ones of the first, second, third, and fourth perimeters of the substrate;

at least two of the third MR structures are formed in different ones of the first, second, third, and fourth perimeters of the substrate; and at least two of the fourth MR structures are formed in different ones of the first, second, third, and fourth perimeters of the substrate.

11. The apparatus of claim 1, wherein each of the first MR structures includes a different respective Tunnel Magnetoresistance (TMR) structure, each of the second MR structures includes a different respective TMR structure, each of the third MR structures includes a different respective TMR structure, and each of the fourth MR structures includes a different respective TMR structure.

12. The apparatus of claim 1, further comprising a processing circuitry that is configured to generate a signal indicative of a level of electrical current through a conductor, the signal being generated based on the output of the sensing bridge.

13. The apparatus of claim 1, wherein the first direction is one of a clockwise direction and a counterclockwise direction, and the second direction is the other one of the clockwise direction and the counterclockwise direction.

14. An apparatus, comprising:

a first magnetoresistance (MR) sensing element including a first sequence of first MR structures that are coupled to each other, the first sequence of first MR structures defining at least one first turn that is wound in a first direction, the first MR structures having first pinning directions that define a first pattern, the first pattern being one of a counterclockwise pattern and a clockwise pattern;

a second MR sensing element including a second sequence of second MR structures that are coupled to each other, the second sequence of second MR structures defining at least one second turn that is wound in a second direction, the second direction being opposite to the first direction, the second MR structures having second pinning directions that define a second pattern, the second pattern being the other one of the counterclockwise pattern and the clockwise pattern;

a third MR sensing element including a third sequence of third MR structures that are coupled to each other, the third sequence of third MR structures defining at least one third turn that is wound in the first direction, the third MR structures having third pinning directions that define the first pattern;

a fourth MR sensing element including a fourth sequence of fourth MR structures that are coupled to each other, the fourth sequence of fourth MR structures defining at least one fourth turn that is wound in the second direction, the fourth MR structures having fourth pinning directions that define the second pattern;

wherein the first, second, third, and fourth sequences are arranged to form a sensing bridge.

15. The apparatus of claim 14, wherein:

a first end of the first sequence is coupled to a node N1, a second end of the first sequence is coupled to a node N2, a first end of the second sequence is coupled to the node N2, a second end of the second sequence is coupled to a node N3, a first end of the third sequence is coupled to the node N3, a second end of the third sequence is coupled to a node N4, a first end of the fourth sequence is coupled to the node N4 and a second end of the fourth sequence is coupled to the node N1; and an output of the sensing bridge is provided on nodes N2 and N4, node N3 is coupled to one of a power source and ground, and node N1 is coupled to the other of the power source and ground.

16. The apparatus of claim 14, further comprising a substrate, wherein the first, second, third, and fourth sequences are formed on the substrate, and each of the first, second, third, and fourth MR structures includes a tunneling magnetoresistance (TMR) vortex.

17. The apparatus of claim 14, further comprising a substrate and a conductor arranged to conduct an electrical current that is being measured by the sensing bridge, wherein the first, second, third, and fourth sequences are formed on the substrate, and the conductor extends through the substrate.

18. The apparatus of claim 14, wherein the first sequence is nested in the second sequence, the second sequence is nested in the third sequence, and the third sequence is nested in the fourth sequence.

19. The apparatus of claim 14, further comprising a conductor that is configured to conduct an electrical current that is being measured by the sensing bridge, wherein each of the first, second, third, and fourth sequences is configured to at least partially surround the conductor.

20. The apparatus of claim 14, further composing a substrate, wherein:

the substrate includes respective first, second, third, and fourth perimeters, the first perimeter being nested in the second perimeter, the second perimeter being nested in the third perimeter, and the third perimeter being nested in the fourth perimeter, and the first MR structures are formed in the first perimeter of the substrate, the second MR structures are formed in the second perimeter of the substrate, the third MR structures are formed in the third perimeter of the substrate, and the fourth MR structures are formed in the fourth perimeter of the substrate.

21. The apparatus of claim 14, further composing a substrate, wherein:

the substrate includes respective first, second, third, and fourth perimeters, the first perimeter being nested in the second perimeter, the second perimeter being nested in the third perimeter, and the third perimeter being nested in the fourth perimeter, and the first MR structures alternate between being situated in the first perimeter and the fourth perimeter;

the second MR structures alternate between being situated in the second perimeter and the third perimeter;

the third MR structures alternate between being situated in the second perimeter and the third perimeter; and the fourth MR structures alternate between being situated in the first perimeter and the fourth perimeter.

22. The apparatus of claim 14, further comprising a substrate, wherein:

the substrate includes respective first, second, third, and fourth perimeters, the first perimeter being nested in the second perimeter, the second perimeter being nested in the third perimeter, and the third perimeter being nested in the fourth perimeter, and at least one of the first MR structures is formed in each of the first, second, third, and fourth perimeters of the substrate;

at least one of the second MR structures is formed in each of the first, second, third, and fourth perimeters of the substrate;

at least one of the third MR structures is formed in each of the first, second, third, and fourth perimeters of the substrate; and at least one of the second MR structures is formed in each of the first, second, third, and fourth perimeters of the substrate.

23. The apparatus of claim 14, further comprising a substrate, wherein:

the substrate includes respective first, second, third, and fourth perimeters, the first perimeter being nested in the second perimeter, the second perimeter being nested in the third perimeter, and the third perimeter being nested in the fourth perimeter, and at least two of the first MR structures are formed in different ones of the first, second, third, and fourth perimeters of the substrate;

at least two of the second MR structures are formed in different ones of the first, second, third, and fourth perimeters of the substrate;

at least two of the third MR structures are formed in different ones of the first, second, third, and fourth perimeters of the substrate; and at least two of the fourth MR structures are formed in different ones of the first, second, third, and fourth perimeters of the substrate.

24. The apparatus of claim 14, wherein each of the first MR structures includes a different respective Tunnel Magnetoresistance (TMR) structure, each of the second MR structures includes a different respective TMR structure, each of the third MR structures includes a different respective TMR structure, and each of the fourth MR structures includes a different respective TMR structure.

25. The apparatus of claim 14, further comprising a processing circuitry that is configured to generate a signal indicative of a level of electrical current through a conductor, the signal being generated based on an output of the sensing bridge.

26. The apparatus of claim 14, wherein the first direction is one of a clockwise direction and a counterclockwise direction, and the second direction is the other one of the clockwise direction and the counterclockwise direction.

27. An apparatus, comprising:

a processing circuitry;

a first magnetoresistance (MR) sensing element including a first sequence of first MR structures that are coupled to each other, the first sequence of first MR structures defining at least one first turn that is wound in a first direction;

a second MR sensing element including a second sequence of second MR structures that are coupled to each other, the second sequence of second MR structures defining at least one second turn that is wound in a second direction, the second direction being opposite to the first direction;

a third MR sensing element including a third sequence of third MR structures that are coupled to each other, the third sequence of third MR structures defining at least one third turn that is wound in the first direction;

a fourth MR sensing element including a fourth sequence of fourth MR structures that are coupled to each other, the fourth sequence of fourth MR structures defining at least one fourth turn that is wound in the second direction;

wherein the first, second, third, and fourth sequences are arranged to form a sensing bridge that is operatively coupled to the processing circuitry, and wherein the processing circuitry is configured to generate an output signal indicative of a level of electrical current through a conductor, the output signal being generated at least in part based on an output of the sensing bridge.

28. The apparatus of claim 27, wherein:

a first end of the first sequence is coupled to a node N1, a second end of the second sequence is coupled to a node N2, a first end of the second sequence is coupled to the node N2, a second end of the second sequence is coupled to a node N3, a first end of the third sequence is coupled to the node N3, a second end of the third sequence is coupled to a node N4, a first end of the fourth sequence is coupled to the node N4 and a second end of the fourth sequence is coupled to the node N1; and an output of the sensing bridge is provided on nodes N2 and N4, node N3 is coupled to one of a power source and ground, and node N1 is coupled to the other of the power source and ground.

29. The apparatus of claim 27, wherein:

each of the first MR structures has a respective first pinning direction, such that the first pinning directions of the first MR structures define a first pattern, the first pattern being one of a counterclockwise pattern and a clockwise pattern;

each of the second MR structures has a respective second pinning direction, such that the second pinning directions of the second MR structures define a second pattern, the second pattern being the other one of the counterclockwise pattern and the clockwise pattern;

each of the third MR structures has a respective third pinning direction, such that the third pinning directions of the third MR structures define the first pattern; and each of the fourth MR structures has a respective fourth pinning direction, such that the fourth pinning directions of the fourth MR structures define the second pattern.

30. The apparatus of claim 27, further composing a substrate, wherein:

the substrate includes respective first, second, third, and fourth perimeters, the first perimeter being nested in the second perimeter, the second perimeter being nested in the third perimeter, and the third perimeter being nested in the fourth perimeter, and the first MR structures alternate between being situated in the first perimeter and the fourth perimeter;

the second MR structures alternate between being situated in the second perimeter and the third perimeter;

the third MR structures alternate between being situated in the second perimeter and the third perimeter; and the fourth MR structures alternate between being situated in the first perimeter and the fourth perimeter.

31. The apparatus of claim 27, further comprising a substrate, wherein:

the substrate includes respective first, second, third, and fourth perimeters, the first perimeter being nested in the second perimeter, the second perimeter being nested in the third perimeter, and the third perimeter being nested in the fourth perimeter, and at least one of the first MR structures is formed in each of the first, second, third, and fourth perimeters of the substrate;

at least one of the second MR structures is formed in each of the first, second, third, and fourth perimeters of the substrate;

at least one of the third MR structures is formed in each of the first, second, third, and fourth perimeters of the substrate; and at least one of the second MR structures is formed in each of the first, second, third, and fourth perimeters of the substrate.

32. The apparatus of claim 27, wherein each of the first, second, third, and fourth MR structures includes a tunneling magnetoresistance (TMR) vortex.

* * * * *